US010178777B2

(12) United States Patent
Cohen

(10) Patent No.: US 10,178,777 B2
(45) Date of Patent: Jan. 8, 2019

(54) CORROSION MITIGATION FOR ETCHED AND/OR PRINTED CIRCUITS

(71) Applicant: Fracatal Antenna Systems, Inc., Bedford, MA (US)

(72) Inventor: Nathan Cohen, Belmont, MA (US)

(73) Assignee: Fractal Antenna Systems, Inc., Bedford, MA (US)

( * ) Notice: Subject to any disclaimer, the term of this patent is extended or adjusted under 35 U.S.C. 154(b) by 0 days.

(21) Appl. No.: 16/002,112

(22) Filed: Jun. 7, 2018

(65) Prior Publication Data

US 2018/0359862 A1     Dec. 13, 2018

Related U.S. Application Data

(60) Provisional application No. 62/516,357, filed on Jun. 7, 2017.

(51) Int. Cl.
*H05K 3/28* (2006.01)
*H05K 1/02* (2006.01)
*H05K 3/12* (2006.01)

(52) U.S. Cl.
CPC .......... *H05K 3/282* (2013.01); *H05K 1/0298* (2013.01); *H05K 3/1258* (2013.01); *H05K 2201/09227* (2013.01)

(58) Field of Classification Search
CPC .... H05K 3/282; H05K 3/1258; H05K 1/0298; H05K 2201/09227
USPC ....................................................... 174/250
See application file for complete search history.

(56) References Cited

U.S. PATENT DOCUMENTS

| 9,647,271 | B2 | 5/2017 | Cohen | |
|---|---|---|---|---|
| 9,847,583 | B1 | 12/2017 | Cohen | |
| 9,935,503 | B2 | 4/2018 | Cohen | |
| 9,965,663 | B2 | 5/2018 | Cohen | |
| 2005/0088344 | A1* | 4/2005 | Saitou | H01Q 1/38 343/700 MS |
| 2008/0088522 | A1* | 4/2008 | Huang | H01Q 1/38 343/846 |
| 2013/0113678 | A1* | 5/2013 | Hay | H01Q 21/065 343/852 |

OTHER PUBLICATIONS

R.G. Hohlfeld and N. Cohen, "Self-Similarity and the Geometric Requirements for Frequency Independence in Antennae," Fractals, vol. 7, No. 1, 79-84, World Scientific Publishing, Co. (1999).
J. Kraus, "Antennas," McGraw-Hill, New York, (1988), pp. 696-704.

* cited by examiner

*Primary Examiner* — Sherman Ng
(74) *Attorney, Agent, or Firm* — Cesari and McKenna, LLP

(57) ABSTRACT

Methods are disclosed which discourage formation of destructive corrosion on or about circuit traces of printed circuit boards, and/or mitigate electronic circuit degradation and or destruction through corrosion of the circuit traces, whereby said corrosion produces changing characteristics of the circuit, and/or shorting to other adjacent circuit traces. Aspects and embodiments of the present disclosure include or provide for forming at least a portion of a circuit trace or traces with fractal and/or self-complementary geometries, or self complementary geometry alone.

6 Claims, 4 Drawing Sheets

CORROSION MITIGATION FOR ETCHED AND/OR PRINTED CIRCUITS

CROSS-REFERENCE TO RELATED APPLICATION

This application is based upon and claims priority to U.S. provisional patent application 62/516,357, entitled "Corrosion Mitigation for Etched and/or Printed Circuits," filed Jun. 7, 2017. The entire content of the noted provisional application is incorporated herein by reference.

BACKGROUND

Decades of progress on creation of circuits have been based on printed traces of conductor, usually on layered substrates, as so-called "printed circuits." These traces act as substitutes for wires, combining discrete electronic components, and or function, on occasion, as components themselves. Inherent in this progress has been the quest for closer positioning of these traces to one another, either vertically and/or horizontally, so as to enable use of smaller components (that is, for example, surface mount components) and or integrated circuits as components, to be utilized in smaller areas, and/or combine more circuitry in a fixed area.

The downside of this progress has been the relative placement of these traces themselves. Such close placement of traces produces a coupling effect of a capacitive nature that is usually accommodated in the actual construction of the overall circuit. However adjacent traces also have differential AC/RF voltages, and these voltages will attempt to drive current charges between and to the adjacent traces. In addition it will be noted that when diverse metals are used such as solder on copper traces, and these traces are closely spaced one another, the galvanic voltage difference from the metals will also drive charges from one trace to an adjacent trace. With these galvanically-different metals the proximity of air will cause oxidation of the metals, from one trace to an adjacent one. This oxidation and subsequent shorting of the traces is highly deleterious to the circuit and is considered a profound failure mode. This voltage driven oxidation process and shorting is a manifestation of corrosion and is an inherent property of galvanically-different metals, and/or voltages on metals, in the presence of air.

The seriousness of such corrosion on circuit boards is mitigated by the use of various coatings acting as insulators and trying to prevent the oxidation. However such coatings do break down with time and UV exposure. Thus this corrosion dominated shorting of traces on circuit boards and the like is a major problem that requires new approaches for solutions.

What is needed is an additional means to deter such corrosion and trace shorting, so disclosed in the present invention.

SUMMARY

Novel methods are disclosed which (i) discourage formation of destructive corrosion on or about circuit traces of printed circuit boards, and/or (ii) mitigate electronic circuit degradation and or destruction through corrosion of the circuit traces, whereby said corrosion produces changing characteristics of the circuit, and/or shorting to other adjacent circuit traces. Aspects and embodiments of the present disclosure include or provide for forming at least a portion of a circuit trace or traces with fractal and/or self-complementary geometries, or self complementary geometry alone.

These, as well as other components, steps, features, objects, benefits, and advantages, will now become clear from a review of the following detailed description of illustrative embodiments, the accompanying drawings, and the claims.

BRIEF DESCRIPTION OF DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION OF ILLUSTRATIVE EMBODIMENTS

Illustrative embodiments are now described. Other embodiments may be used in addition or instead. Details that may be apparent or unnecessary may be omitted to save space or for a more effective presentation. Some embodiments may be practiced with additional components or steps and/or without all of the components or steps that are described.

As referenced above, the present disclosure describes novel methods to (i) discourage formation of destructive corrosion on or about circuit traces of printed circuit boards, and (ii) mitigate electronic circuit degradation and or destruction through corrosion of the circuit traces, whereby said corrosion produces changing characteristics of the circuit, and/or shorting to other adjacent circuit traces.

Reference is made, but not uniquely limited to, so-called "printed circuit boards" or "PCBs," comprising regions of conductive circuit (traces) and non-conductive layer (substrate).

Figure 1:
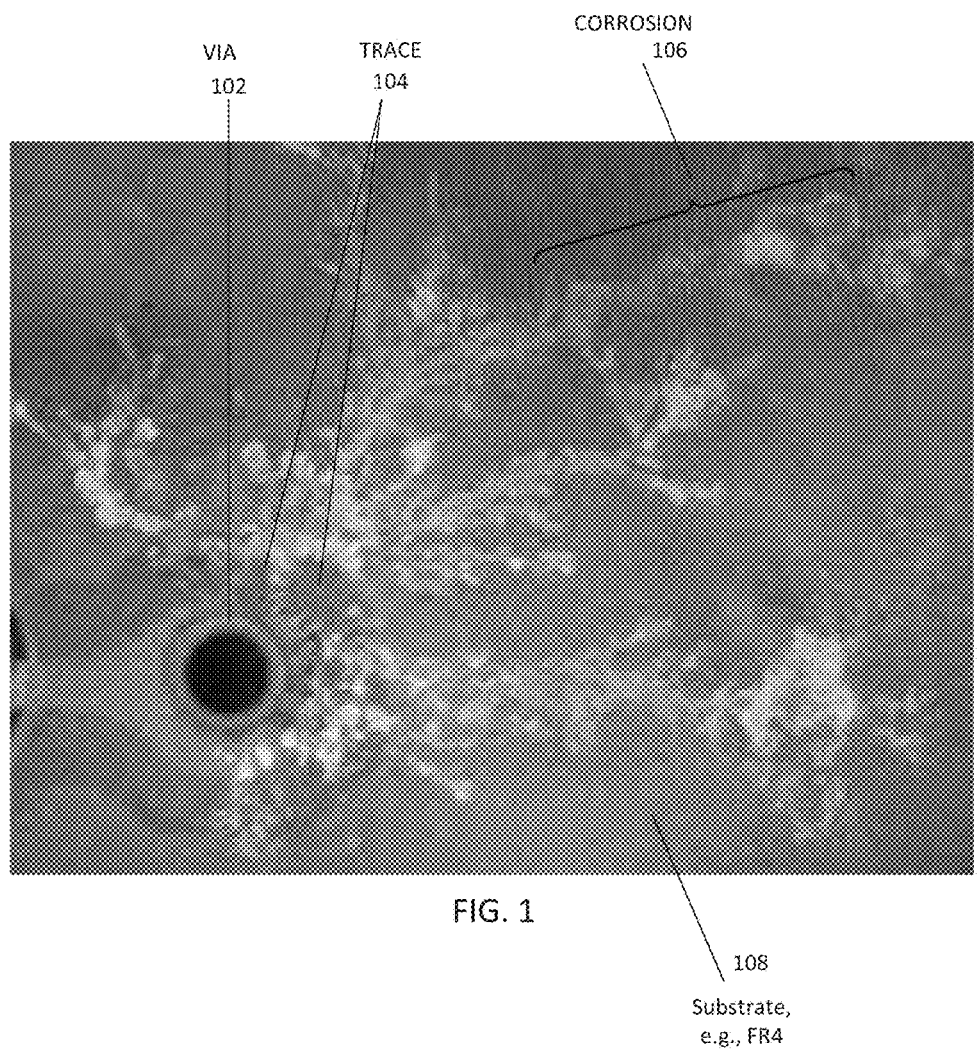
FIG. 1 depicts a photograph of a PCB with a via and trace shown along with corrosion being shown.

The noted corrosion is described as a process where migration of material is caused by a chemical process invoking motion by electrical charge. For example, this migration may be provoked by galvanic differentials of two different metals, or a voltage difference between adjacent or nearby circuit traces. Over time this will produce migration that can, for example, short out two adjacent traces. Finger-like, or fractal, dendritic structures (also referred to as "fingering"), are often produced in these migrations, and ultimately these dendritic structures short and thus destroy traces, or lower the threshold voltage ("dielectric breakdown") to bridge such gaps between traces. See FIG. 1. As shown, FIG. 1 depicts a photograph of a PCB with a via 102 and trace 104 (circular in part) shown. Corrosion is shown, some of which is noted as 106. Substrate 108, e.g., FR4 or other suitable PCB board material is also shown.

To mitigate the deleterious effects of such corrosion, aspects and embodiments of the present disclosure include and/or provide for forming at least a portion of a circuit trace or traces with fractal and/or self-complementary geometries, or self-complementary geometry alone.

It will be appreciated that "adjacent traces" signifies either traces nearby to each other e.g., horizontally, or traces separated by layering in a multi-layer "board." It will also be appreciated that no distinction for this invention is necessarily made between traces that are formed by etching, deposition, or any other process used to place or make or mount the traces on a substrate.

Such a trace incorporating a fractal shape is best described as having self similarity such that a geometric motif is replicated in the making of the trace over two or more size scales. It will be noted that the mathematician's definition of "fractal," which often incorporates an infinite number of such magnification replications or, iterations, is not strictly implicated herein, as it has no bearing on actual physical objects. It will be noted from review of the inventor's prior patents on fractal related inventions—such as U.S. Pat. Nos. 9,965,663, 9,935,503, 9,847,583, and 9,647,271—that this working definition of "fractal," i.e., having fewer or a set number or range of number of iterations, has become an accepted and well-known. It will be appreciated that all uses of the term "fractal" in the context of the present disclosure refers to at least portions of the trace where there is a fractal iteration on two or more size scales. All of the above-referenced patents are incorporated herein by reference in their entireties.

Figure 2:
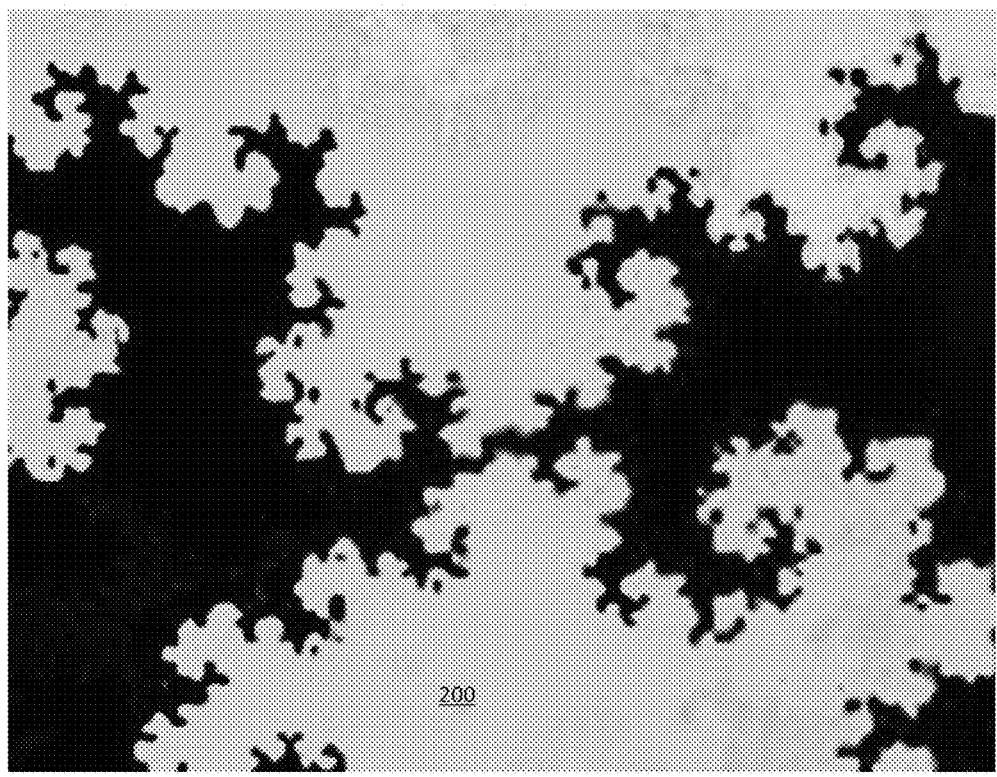
FIG. 2 illustrates an example of an embodiment including a fractal aspect of the present disclosure.

An example of a fractal aspect of the present disclosure, but not a limitation of possibilities, is shown in FIG. 2. The fractal aspect allows confinement of the corrosion process to fixed or confined regions of the board where it is already established or believed that voltage differentials will lead to corrosion of adjacent traces.

Another aspect of the present disclosure includes features (surfaces and/or three-dimensional shapes) that are self-complementary. Self-complementary shapes as the term is used herein are those that have a closed area (area made with or including one or more materials, e.g., a conductor) that is congruent to an open area such that the open and closed areas can be brought into coincidence through a rigid motion such as offset (translation), reflection, or rotation. The open and closed areas can each be composite areas, i.e., they may have separate portions. These features can be used in and/or for the production of electricity and/or the mitigation of corrosion of conductive traces, e.g., as present in a printed circuit board or other circuit structure.

Self complementary structures are another method of geometric shaping applied or applicable to embodiments of the present disclosure. In exemplary embodiments, the geometric shape is regarded as a positive section, in this case the trace, adjacent to a negative one, that is an insulator or non conducting substrate, as a mask and the mask and the positive section are equivalent in shape through a mirror reflection about an axis or a solid rotation about a point. It has been known for some time that self complementary structures in electromagnetics produce impedances across a wide range of frequency that remain the same or very similar. See, e.g., R. G. Hohlfeld and N. Cohen, "Self-Similarity and the Geometric Requirements for Frequency Independence in Antennae," Fractals, Vol. 7, No. 1, 79-84, World Scientific Publishing Co. (1999); accord J. Kraus, "Antennas," McGraw-Hill, New York, (1988); the entire contents of both of which are incorporated herein by reference.

Electrical charges are thus similar across a wide frequency range in self complementary structures; it will be noted that for this to occur, the distribution of electrical charge cannot be constrained to a single point or a small collection of points but tends to be itself more uniformly distributed. The self-complementary shaping of the circuit trace and/or adjacent circuit trace or traces, forces local uniformity of electric fields, thereby constituting a uniform impedance interface of the conductive traces with the non-conducting substrate. This uniformity of impedance discourages the formation of migratory channels, such as dendrites, which produce the undesired result (corrosion).

As was mentioned above, a further aspect of the present disclosure is directed to and can provide features (surfaces and/or three-dimensional shapes) that are self-complementary. Such features can be used, e.g., for batteries and/or battery components in exemplary applications.

Figure 3:
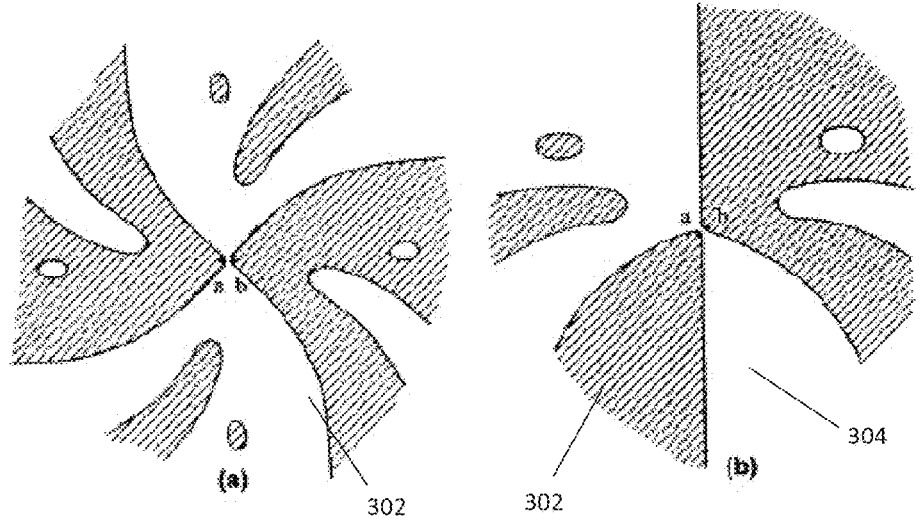
FIG. 3, which includes views (a)-(d), depicts examples of self-complementary shapes useful for embodiments of the present disclosure.
Figure 3:
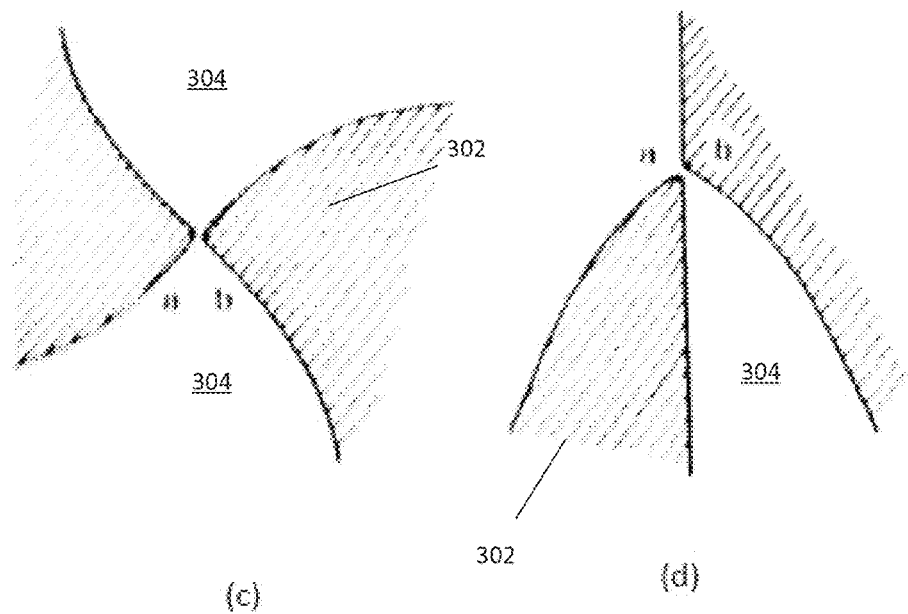

FIG. 3, which includes views (a)-(d), depicts examples 300 of self-complementary shapes useful for embodiments of the present disclosure. Features (e.g., surfaces and/or three-dimensional shapes) that are self-complementary can be included in various aspects of the subject technology (e.g., embodiments according to the present disclosure). These features can be used in and/or for the production of electricity and/or corrosion mitigation or prevention, for example. Exemplary embodiments of the present disclosure can include one or more conductive traces (e.g., of or in a PCB) that include one or more self-complementary features. Such traces can be used in or for printed circuits and printed circuit boards.

As shown in FIG. 3, shaded areas, e.g., area(s) 302, can indicate surfaces or solid features that are covered with or include conductive material(s). For example, such shaded area(s) 302 can include the surface of a conductive trace included within a printed circuit board according to the present disclosure. Unshaded areas 304 can refer to or indicate open areas, e.g., voids or areas without conductive material(s).

Of course, while FIG. 3 depicts certain examples of self-complementary shapes useful for embodiments of the present disclosure, many other self-complementary shapes are contemplated within the scope of the present disclosure.

Figure 4:
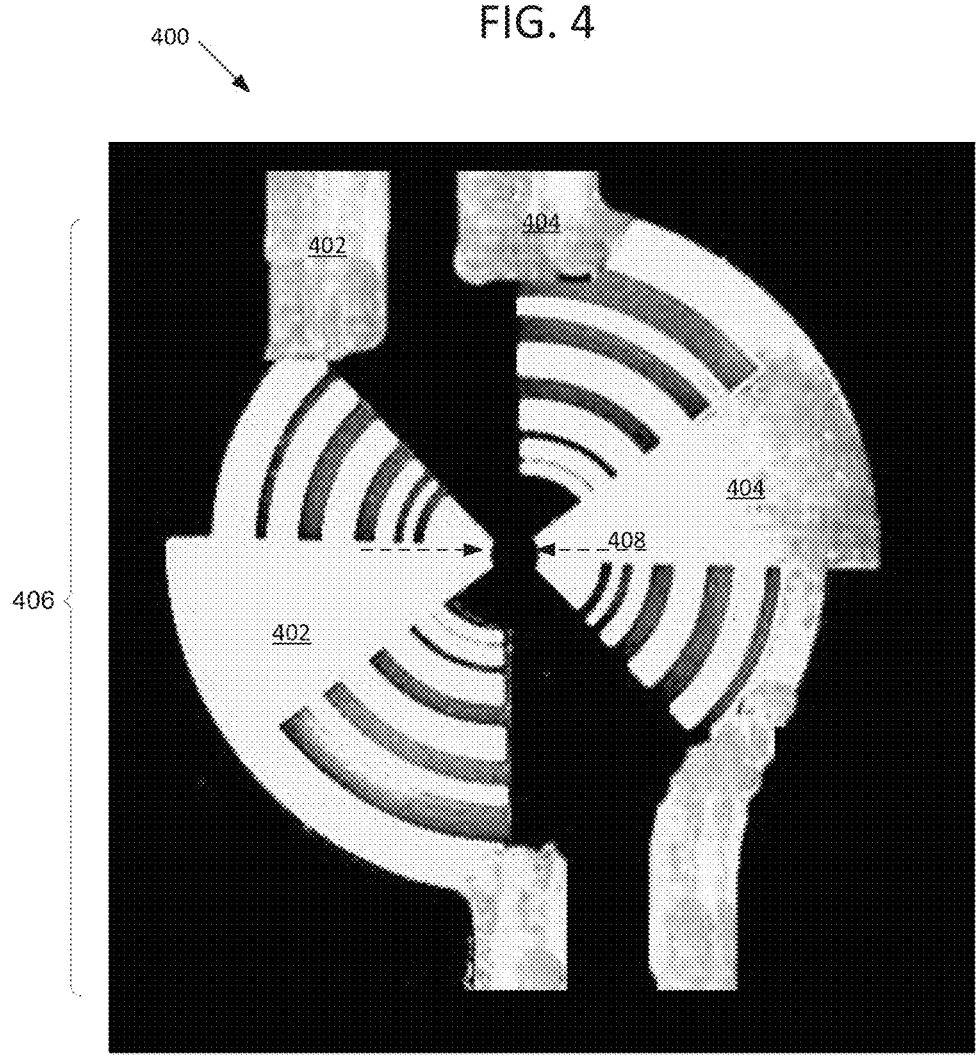
FIG. 4 is a photograph depicting a self-complementary trace structure in accordance with an exemplary embodiment of the present disclosure.

FIG. 4 is a photograph depicting a self-complementary trace structure 400 in accordance with an exemplary embodiment of the present disclosure. As shown by the close-up perspective in the figure, structure 400 includes two traces 402, 404 in close proximity and with a fractal self complementary section 406 used to mitigate corrosion and inhibit shorting of the two traces 402, 404. An exemplary separation distance 408 between traces 402, 404 is shown.

Of course while structure 400 is shown as including or presenting traces 402 and 404 on the same circuit layer, in other embodiments similar traces can be present on different layers of a circuit or circuit board; there may be one or more intervening layers and/or circuit or board structures between such traces.

Self-complementary features, e.g., as shown in FIG. 3-4 or other such features, can provide for or facilitate desirable electrical characteristics such as constant or substantially constant impedance across the surface of the feature; such constant impedance can be for or at one or more frequencies, e.g., from a range of 5-100 Hz, including for example 60 Hz; other ranges may of course be used/produced within the scope of the present disclosure. Thus, printed circuits, circuits, and printed circuit boards that utilize such features can facilitate or provide increased or improved resistance to corrosion.

Exemplary embodiments can include conductive traces or components that have both fractal-based and self-complementary based features. For example, a circuit according to the present disclosure may include a conductive trace that has fractal-based features and another conductive trace (and/or substrate) that includes self-complementary based features.

Exemplary Embodiments

1. A printed circuit board or circuit structure, including: a first printed circuit substrate, the first printed circuit substrate comprising a substrate layer and a first conductive circuit trace system utilizing multiple traces connecting components to produce a circuit; and wherein for at least some portions (e.g., a shaped portion) of the circuit, the separation distance between the conductive traces is substantially the same or smaller than the width of a conductive trace; wherein the portions are arranged to form individual fractal shapes and the shaped portions are separated but interlaced with the substrate such that the shaped portions and substrate are self complementary.

2. A printed circuit board or circuit structure, comprising:
a first printed circuit substrate, the first printed circuit substrate comprising a substrate layer and a first conductive circuit trace system utilizing multiple traces connecting components to produce a circuit; and
wherein the circuit includes a shaped (e.g., fractalized, fractal, self-complementary) portion (or portions) for which the separation between the conductive traces is substantially the same or smaller than the width of a conductive trace;
wherein the shaped portion(s) include(s) individual shapes (e.g., as shown in FIG. 4) separated and positioned with respect to the substrate such that the shaped portions and/or the substrate are self complementary.

3. The printed circuit board of embodiment 1 or 2, wherein the shaped portion(s) include(s) two traces configured in a self-complementary structure; three or more traces may alternatively be used for the circuit of any embodiment.

4. The printed circuit board of embodiment 1 or 2, wherein the shaped portion and substrate produce a substantially uniform distribution of electrical charge and mitigate the process of trace corrosion.

5. The printed circuit board of embodiment 1 or 2, wherein the shaped portion and substrate produce a substantially uniform distribution of electrical charge and mitigate the process of trace corrosion and deter the shorting of adjacent planar circuit traces.

6. The printed circuit board of embodiment 1 or 2, wherein the shaped portions and substrate produce a substantially uniform distribution of electrical charge and mitigate the process of trace corrosion and deter the shorting of adjacent circuit traces from stacked multiple layer circuit boards.

7. The printed circuit board of embodiment 1 or 2, wherein the shaped portion includes two traces configured in a self-complementary structure.

8. The printed circuit board of embodiment 1 or 2, wherein the shaped portion includes two traces configured in a fractal structure.

9. The printed circuit board of embodiment 1 or 2, wherein the shaped portions and the substrate are self complementary.

10. The printed circuit board of embodiment 1 or 2, wherein the shaped portions are interlaced.

11. Any of the foregoing embodiments (1-10) implemented as a portion of a larger circuit, circuit board, printed circuit board, and/or circuit structure on one or more substrate layers.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

All articles, patents, patent applications, and other publications that have been cited in this disclosure are incorporated herein by reference.

The phrase "means for" when used in a claim is intended to and should be interpreted to embrace the corresponding structures and materials that have been described and their equivalents. Similarly, the phrase "step for" when used in a claim is intended to and should be interpreted to embrace the corresponding acts that have been described and their equivalents. The absence of these phrases from a claim means that the claim is not intended to and should not be interpreted to be limited to these corresponding structures, materials, or acts, or to their equivalents.

The scope of protection is limited solely by the claims that now follow. That scope is intended and should be interpreted to be as broad as is consistent with the ordinary meaning of the language that is used in the claims when interpreted in light of this specification and the prosecution history that follows, except where specific meanings have been set forth, and to encompass all structural and functional equivalents.

Relational terms such as "first" and "second" and the like may be used solely to distinguish one entity or action from another, without necessarily requiring or implying any actual relationship or order between them. The terms "comprises," "comprising," and any other variation thereof when used in connection with a list of elements in the specification or claims are intended to indicate that the list is not exclusive and that other elements may be included. Similarly, an element proceeded by an "a" or an "an" does not, without further constraints, preclude the existence of additional elements of the identical type.

None of the claims are intended to embrace subject matter that fails to satisfy the requirement of Sections 101, 102, or 103 of the Patent Act, nor should they be interpreted in such a way. Any unintended coverage of such subject matter is hereby disclaimed. Except as just stated in this paragraph, nothing that has been stated or illustrated is intended or should be interpreted to cause a dedication of any component, step, feature, object, benefit, advantage, or equivalent to the public, regardless of whether it is or is not recited in the claims.

The abstract is provided to help the reader quickly ascertain the nature of the technical disclosure. It is submitted with the understanding that it will not be used to interpret or limit the scope or meaning of the claims. In addition, various features in the foregoing detailed description are grouped together in various embodiments to streamline the disclosure. This method of disclosure should not be interpreted as requiring claimed embodiments to require more features than are expressly recited in each claim. Rather, as the following claims reflect, inventive subject matter lies in less than all features of a single disclosed embodiment. Thus, the following claims are hereby incorporated into the detailed description, with each claim standing on its own as separately claimed subject matter.

What is claimed is:
1. A printed circuit board, comprising:
a first printed circuit substrate, the first printed circuit substrate comprising a substrate layer and a first con- ductive circuit trace system utilizing multiple traces connecting components to produce a circuit; and wherein the circuit includes a shaped portion for which a separation distance between the conductive traces is substantially the same or smaller than the width of a conductive trace;

wherein the shaped portion includes individual shapes that are separated and positioned with respect to the substrate such that the shaped portions are self complementary, wherein the shaped portion and substrate produce a substantially uniform distribution of electrical charge and mitigate the process of trace corrosion and deter the shorting of adjacent planar circuit traces.

2. The printed circuit board of claim 1, whereby the shaped portions and substrate produce a substantially uniform distribution of electrical charge and mitigate the process of trace corrosion and deter the shorting of adjacent circuit traces from stacked multiple layer circuit boards.

3. The printed circuit board of claim 1, wherein the shaped portion includes two traces configured in a self-complementary structure.

4. The printed circuit board of claim 1, wherein the shaped portion includes two traces configured in a fractal structure.

5. The printed circuit board of claim 1, wherein the shaped portions and the substrate are self-complementary.

6. The printed circuit board of claim 1, wherein the shaped portions are interlaced.

* * * * *